United States Patent
Kao et al.

(10) Patent No.: US 7,449,748 B2
(45) Date of Patent: Nov. 11, 2008

(54) SEMICONDUCTOR DEVICE

(75) Inventors: Ching-Hung Kao, Hsinchu Hsien (TW);
Chin-Shun Lin, Miaoli County (TW)

(73) Assignee: United Microelectronics Corp.,
Hsinchu (TW)

( * ) Notice: Subject to any disclaimer, the term of this patent is extended or adjusted under 35 U.S.C. 154(b) by 164 days.

(21) Appl. No.: 11/306,817

(22) Filed: Jan. 12, 2006

(65) Prior Publication Data

US 2007/0170539 A1    Jul. 26, 2007

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/341; 257/401; 257/409

(58) Field of Classification Search ................. 257/487, 257/491, 409, 367, 288, 341, 401
See application file for complete search history.

(56) References Cited

U.S. PATENT DOCUMENTS

| 6,190,948 | B1 * | 2/2001 | Seok .......................... 438/140 |
| 2007/0057293 | A1 * | 3/2007 | Kao .......................... 257/288 |
| 2007/0080389 | A1 * | 4/2007 | Petruzzello et al. ......... 257/312 |

* cited by examiner

*Primary Examiner*—Monica Lewis
(74) *Attorney, Agent, or Firm*—Jianq Chyun IP Office

(57) ABSTRACT

The invention is directed to a method for manufacturing a field plate of a high voltage device. The field plate is located on a drift region of a substrate, wherein an isolation structure is located on the drift region. The method comprises steps of forming a first dielectric layer over the substrate and then forming a first patterned conductive layer on the first dielectric layer, wherein the first patterned conductive layer is located over the isolation structure and exposes a portion of a top surface of the first dielectric layer. The exposed portion of the first dielectric layer is removed until a top surface of the isolation structure so as to form a plurality of vertical fin-type dielectric bottoms.

10 Claims, 4 Drawing Sheets

SEMICONDUCTOR DEVICE

BACKGROUND OF THE INVENTION

1. Field of Invention

The present invention relates to a semiconductor device and a method for manufacturing thereof. More particularly, the present invention relates to a field plate of a high voltage device and a method for manufacturing thereof.

2. Description of Related Art

With the decreasing of the semiconductor device's size, the channel length is decreased. Therefore, the operation speed of the transistor is increased. However, the short channel effect is getting seriously as the channel length is decreased. According to the well known equation: electric field=voltage/length, the intensity of the electric field is increased with the decreasing of the channel length while the applied voltage is constant. Hence, the energy of the electrons within the channel is dramatically increased with the enhancing of the electric field so as to increase possibility of the electrical breakdown of the device. Moreover, as for the high voltage device, when the device integration of the integrated circuit is increased, the performance of the high voltage device is also an important issue to be concerned. Therefore, during the formation of the high voltage device, it is necessary to specially arrange the elements of the high voltage device so as to increase the sustainability of the high voltage device while operating under the high voltage.

Currently, during the formation of the high voltage device, an isolation structure is formed in the substrate and then a dielectric layer is formed over the substrate. Thereafter, a portion of the dielectric layer is removed to expose the substrate and a portion of the isolation structure. Further, a conductive layer is formed over the substrate and then a portion of the conductive layer is patterned. Nevertheless, during the patterning process performed on the conductive layer located on the substrate, a portion of the top surface of the substrate is damaged to form pinholes therein. That is, since the material for forming the conductive layer is similar to that of the substrate, there is no etching selectivity difference. Therefore, the top surface of the substrate is easily to be damaged and leads to the unstable electrical performance of the later formed device. Hence, the reliability of the device is decreased.

SUMMARY OF THE INVENTION

Accordingly, at least one objective of the present invention is to provide a method for manufacturing a field plate of a high voltage device capable of preventing the top surface of the substrate from being damaged.

At least another objective of the present invention is to provide a high voltage device capable of disturbing the lateral electric field and increasing the breakdown voltage.

To achieve these and other advantages and in accordance with the purpose of the invention, as embodied and broadly described herein, the invention provides a method for manufacturing a field plate of a high voltage device. The field plate is located on a drift region of a substrate, wherein an isolation structure is located on the drift region. The method comprises steps of forming a first dielectric layer over the substrate and then forming a first patterned conductive layer on the first dielectric layer, wherein the first patterned conductive layer is located over the isolation structure and exposes a portion of a top surface of the first dielectric layer. The exposed portion of the first dielectric layer is removed until a top surface of the isolation structure so as to form a plurality of vertical fin-type dielectric bottoms.

According to one embodiment of the present invention described above, the thickness of the isolation structure together with the first dielectric layer located on the isolation structure is about 13000~30000 angstroms.

According to one embodiment of the present invention described above, the thickness of the isolation structure is about 8000~12000 angstroms.

According to one embodiment of the present invention described above, the material of the first dielectric layer is selected from a group consisting of silicon oxide and silicon nitride.

According to one embodiment of the present invention described above, the material of the first patterned conductive layer includes polysilicon.

According to one embodiment of the present invention described above, the method for forming the first patterned conductive layer comprises steps of forming a conductive material layer over the substrate and then patterning the conductive material layer to form the first patterned conductive layer by using the dielectric layer as an etching stop layer.

According to one embodiment of the present invention described above, after the exposed portion of the first dielectric layer is removed, the method further comprises a step of forming a second patterned conductive layer over the substrate, wherein the second patterned conductive layer extends downwardly from the top of the first patterned conductive layer and covers the sidewall of each vertical fin-type dielectric bottoms and a portion of the isolation structure exposed by the vertical fin-type dielectric bottoms, and the second patterned conductive layer is insulated from the first patterned conductive layer.

According to one embodiment of the present invention described above, the material of the second patterned conductive layer includes polysilicon.

According to one embodiment of the present invention described above, before the second patterned conductive layer is formed, the method further comprises a step of forming a second dielectric layer to cover the first patterned conductive layer, wherein the second dielectric layer is located between the first patterned conductive layer and the second patterned conductive layer.

According to one embodiment of the present invention described above, the second patterned conductive layer exposes a portion of the second dielectric layer over the first patterned conductive layer.

According to one embodiment of the present invention described above, the method for forming the second dielectric layer comprises a step of performing an oxidization process to form a sacrificed oxide layer over the first patterned conductive layer.

According to one embodiment of the present invention described above, the isolation structure includes a field oxide layer.

The present invention also provides a high voltage device on a substrate, wherein the substrate has a drift region and an isolation structure located on the drift region. The high voltage device comprises a field plate structure located on the isolation structure. The field plate structure is composed of a plurality of vertical fin-type units and each of the vertical fin-type units comprises a vertical fin-type dielectric bottom, a first conductive layer and a second conductive layer. A portion of the isolation structure is exposed between the vertical fin-type dielectric bottoms. The first conductive layer is located on the vertical fin-type dielectric bottom. The second conductive layer covers a portion of the first conductive layer and covers the exposed portion of the isolation structure between the vertical fin-type dielectric bottoms.

According to one embodiment of the present invention described above, the second conductive layer and the first conductive layer are insulated from each other.

According to one embodiment of the present invention described above, the thickness of each of the vertical fin-type dielectric bottom together with the isolation structure is about 13000~30000 angstroms.

According to one embodiment of the present invention described above, the thickness of the isolation structure is about 8000~12000 angstroms.

According to one embodiment of the present invention described above, the material of each of the vertical fin-type dielectric bottoms is selected from a group consisting of silicon oxide and silicon nitride.

According to one embodiment of the present invention described above, the material of the first conductive layer includes polysilicon.

According to one embodiment of the present invention described above, the material of the second conductive layer includes polysilicon.

According to one embodiment of the present invention described above, each of the vertical fin-type dielectric bottoms further comprises a sacrificed oxide layer covering the first conductive layer and located between the first conductive layer and the second conductive layer.

According to one embodiment of the present invention described above, for each of the vertical fin-type dielectric layer, the first conductive layer and the second conductive layer are arranged alternatively.

According to one embodiment of the present invention described above, the high voltage device further comprises a source region, a drain region, a channel region and a gate electrode. The source region is located in the substrate and the drain region is located in the substrate, wherein the isolation structure located on the substrate between the source region and the drain region. The channel region is located in the substrate between the source region and the drift region. The gate electrode is located over the substrate and adjacent to the source region, wherein the gate electrode is an extension portion of the second conductive layer so that the gate electrode covers a portion of the isolation structure.

By using the method according to the present invention, the top surface of the substrate is prevented from being damaged to form pinholes during the first patterned conductive layer is formed. In the field plate of the high voltage device, the sum thickness of the isolation structure and the vertical fin-type dielectric bottom are relatively large so that the vertical electric field is disturbed. Moreover, the second patterned conductive layer can disturb the lateral electric field so as to increase the breakdown voltage of the high voltage device and to decrease the current leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

FIGS. 1A through 1D are cross-sectional views schematically illustrating a method for manufacturing a field plate of a high voltage device according to one embodiment of the present invention.

Figure 1A:
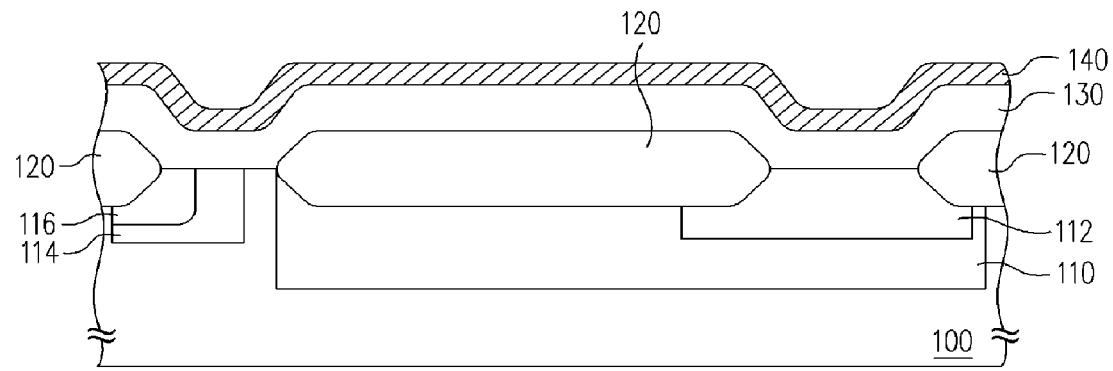
FIGS. 1A through 1D are cross-sectional views schematically illustrating a method for manufacturing a field plate of a high voltage device according to one embodiment of the present invention.

As shown in FIG. 1A, a substrate 100 is provided, wherein the substrate 100 has a drift region 110, an isolation structure 120, a drain region 112, a channel region 114 and a source region 116. The isolation structure 120 is located on the drift region 110 and the isolation structure 120 can be, for example but not limited to, a field oxide layer. The source region 116 is located in the substrate 100 at one side of the isolation structure 120 and the drain region 112 is located in the substrate 100 at another side of the isolation structure 120. The channel region 114 is located in the substrate 100 between the source region 116 and the drift region 110. Moreover, a dielectric layer 130 is formed over the substrate 100. The material of the dielectric layer 130 can be, for example, silicon nitride or silicon oxide. The method for forming the dielectric layer 130 can be, for example, a chemical vapor deposition or other proper method. Then, a conductive material layer 140 is formed on the dielectric layer 130. The conductive material layer 140 can be, for example but not limited to, made of polysilicon. The method for forming the conductive layer 140 includes a chemical vapor deposition or other proper method.

In this embodiment, the thickness of the isolation structure 120 is about 8000~12000 angstroms. Furthermore, the thickness of the isolation structure 120 together with the dielectric layer 130 is about 13000~30000 angstroms. The sum thickness of the isolation structure 120 and the dielectric layer 130 is relatively large so that the vertical electric field of the high voltage device is disturbed and the possibility of the breakdown of the high voltage device happening earlier than expected is decreased.

Figure 1B:
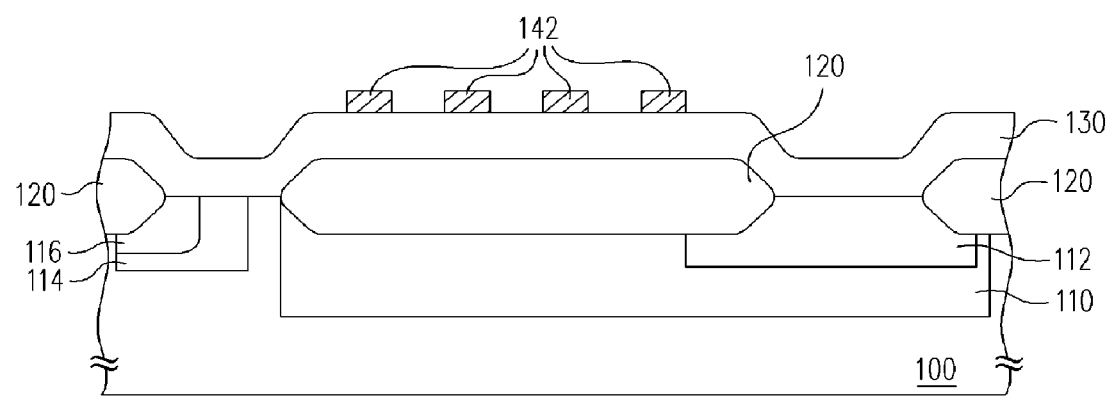

As shown in FIG. 1B, the conductive material layer 140 is patterned to form a patterned conductive layer 142. The patterned conductive layer 142 is located over the isolation structure 120 and exposes a portion of the dielectric layer 130. The method for patterning the conductive layer comprises a step of performing an etching process on the conductive layer 140 with the use of the dielectric layer 130 as an etching stop layer. The dielectric layer 130 used as an etching stop layer for forming the patterned conductive layer 142 covers the substrate 100 so that the dielectric layer 130 can protect the substrate 100 from being damaged by the etchant to form pinholes in the substrate 100.

Figure 1C:
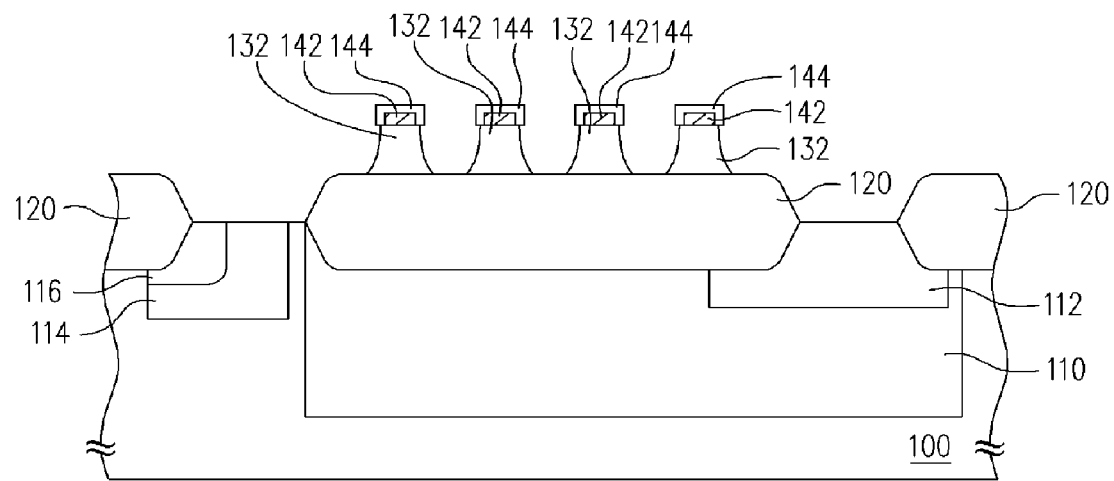

As shown in FIG. 1C, the exposed portion of the dielectric layer 130 is removed until a portion of the isolation structure 120 is exposed so as to form several vertical fin-type dielectric bottoms 132. The method for removing the exposed portion of the dielectric layer 130 includes a wet etching process and dry etching process. The etchant for removing the exposed portion of the dielectric layer 130 possesses a relatively high etching selective ratio of the dielectric layer 130 to the substrate 100. Therefore, the surface of the substrate 100 is not damaged by the etchant during the exposed portion of the dielectric layer 130 is removed. As shown in FIG. 1C, a dielectric layer 144 is formed on the top surface of the patterned conductive layer 142. The method for forming the dielectric layer 144 comprises a step of performing a thermal oxidation process to transfer the top surface of the patterned conductive layer 142 into a sacrificed oxide layer.

Figure 1D:
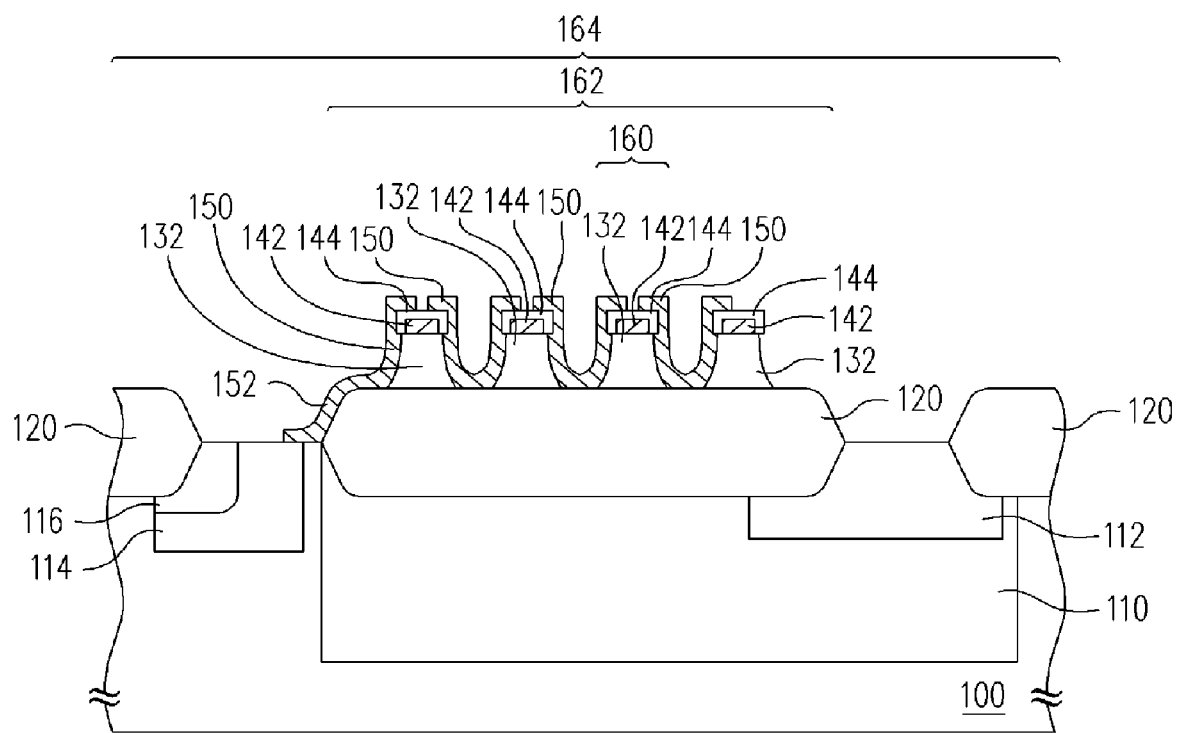

As shown in FIG. 1D, a patterned conductive layer 150 is formed over the substrate 100. The method for forming the patterned conductive layer 150 comprises steps of forming a conductive material layer (not shown) over the substrate 100 and then patterning the conductive material layer. The material of the conductive material layer can be, for example but not limited to, polysilicon. The method for forming the conductive material layer can be, for example, a chemical vapor deposition or other proper process. The patterned conductive layer 150 extends downwardly from the top of the patterned conductive layer 142 and covers the sidewall of each of the vertical fin-type dielectric bottoms 132 and further covers the exposed isolation structure 120 between the vertical fin-type dielectric bottoms 132. It should be noticed that since the patterned conductive layer 150 covering the exposed isolation structure 120 generates the shielding effect so as to disturb the lateral electric field and to increase the breakdown voltage and to decrease the current leakage.

As shown in FIG. 1D, the dielectric layer 144 is located between the patterned conductive layer 142 and the patterned conductive layer 150 so that the patterned conductive layer 150 and the patterned conductive layer 142 are insulated from each other. The material of the patterned conductive layer 150 includes polysilicon. Furthermore, the patterned conductive layer 150 exposes a portion of the dielectric layer 144 over the patterned conductive layer 142. That is, the patterned conductive layer 150 and the patterned conductive layer 142 are arranged alternatively.

The aforementioned vertical fin-type dielectric bottoms 132, the patterned conductive layer 142, the dielectric layer 144 and the patterned conductive layer 150 together form a vertical fin-type unit 160. Several vertical fin-type units 160 together form a field plate structure 162. The field plate structure 162 is one element of the high voltage device.

Moreover, the gate electrode 152 is located on the substrate 100 and adjacent to the source region 116, wherein the gate electrode 152 is an extension portion of the patterned conductive layer 150 so that the gate electrode 152 covers a portion of the isolation structure 120. The field plate structure 162, the source region 116, the drain region 112, the channel region 114 and the gate electrode 152 together form a high voltage device 164.

By using the method according to one embodiment of the present invention, the top surface of the substrate 100 is protected from being damaged during the etching process and the breakdown voltage of the high voltage device is increased and the current leakage is decreased.

Figure 2:
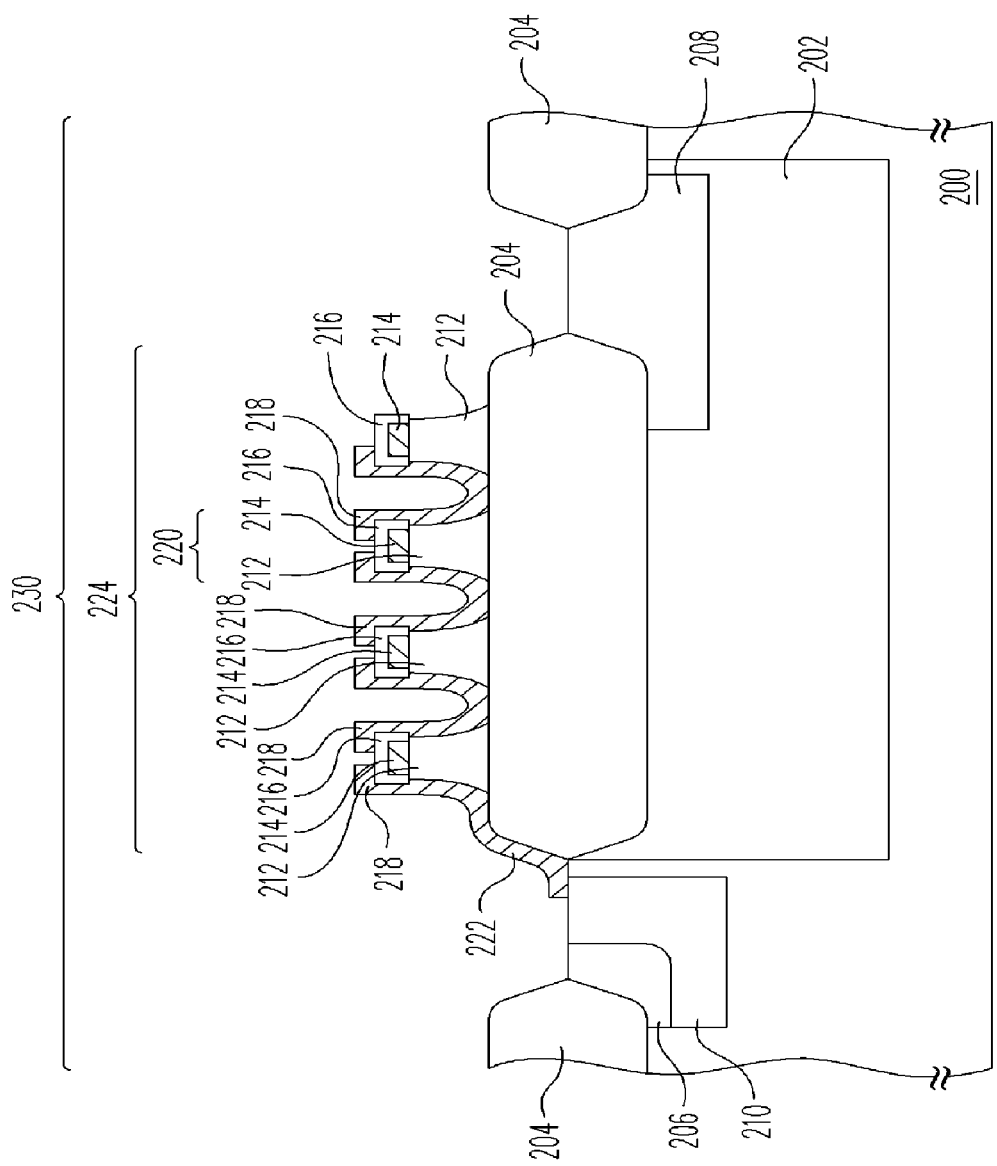
FIG. 2 is a cross-sectional view showing a high voltage device according to another embodiment of the present invention.

FIG. 2 is a cross-sectional view showing a high voltage device according to another embodiment of the present invention.

As shown in FIG. 2, a substrate 200 having a drift region 202, an isolation structure 204 on the drift region 202 is provided. A source region 206 and a drain region 208 are located in the substrate 200, wherein the isolation structure 204 is located between the source region 206 and the drain region 208. A channel region 210 is located in the substrate 200 between the source region 206 and the drift region 202.

A plurality of vertical fin-type units 220 are located on the isolation structure 204. The vertical fin-type units 220 together form a field plate structure 224. Each of the vertical fin-type units 220 comprises a vertical fin-type dielectric bottom 212, a conductive layer 214, a sacrificed oxide layer 216 and a conductive layer 218.

The vertical fin-type dielectric bottom 212 is located on the isolation structure 204 and the material of the vertical fin-type dielectric bottom 212 can be, for example, silicon oxide or silicon nitride. A portion of the isolation structure 204 is exposed between the adjacent vertical fin-type dielectric bottoms 212. The thickness of the isolation structure 204 is about 8000~12000 angstroms. The thickness of each of the vertical fin-type dielectric bottoms 212 together with the isolation structure 204 is about 13000~30000 angstroms. The sum thickness of the vertical fin-type dielectric bottom 212 and the isolation structure 204 is relatively large so that the effect of the vertical electric field on the high voltage device is decreased. Furthermore, the possibility of the breakdown of the high voltage device happening earlier than expected is decreased.

The conductive layer 214 is located on the vertical fin-type dielectric bottom 212. The conductive layer 218 covers a portion of conductive layer 214 and covers the exposed portion of the isolation structure 204 between the vertical fin-type dielectric bottoms 212. The conductive layer 214 and the conductive layer 218 can be, for example but not limited to, made of polysilicon. For each of the vertical fin-type units 220, the conductive layer 214 and the conductive layer 218 are arranged alternatively. The sacrificed oxide layer 216 covers the conductive layer 214 and is located between the conductive layer 214 and the conductive layer 218. Therefore, the conductive layer 214 and the conductive layer 218 are insulated from each other.

Notably, since the conductive layer 218 covers the exposed portion of the isolation structure 204, the shielding effect happens. Accordingly, the lateral electric field of the device is disturbed and the breakdown voltage of the high voltage device is increased and the current leakage is decreased.

Moreover, the gate electrode 222 is located on the substrate 200 and is adjacent to the source region 206. The gate electrode 222 is an extension portion of the conductive layer 218 so that the gate electrode 222 covers a portion of the isolation structure 204. The field plate structure 224, the source region 206, the drain region 208, the channel region 210 and the gate electrode 222 together form a high voltage device 230.

Altogether, the present invention possesses at least the advantages shown as following:

(1) During the patterned conductive layer 142 is formed, the dielectric layer 130 located over the substrate 100 can be an etching stop layer so as to protect the top surface of the substrate 100 from being damaged to form pinholes.

(2) The sum thickness of the vertical fin-type dielectric bottom and the isolation structure is large enough to decrease the effect of the vertical electric field on the high voltage device so that the current leakage is decreased.

(3) The patterned conductive layer 150 can effectively disturb the lateral electric field so as to increase the breakdown voltage of the high voltage device and decrease the current leakage.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A high voltage device on a substrate, wherein the substrate has a drift region and an isolation structure located on the drift region, the high voltage device comprising:
   a field plate structure located on the isolation structure, wherein the field plate structure is composed of a plurality of vertical fin-type units and each of the vertical fin-type units comprises:
      a vertical fin-type dielectric bottom, wherein a portion of the isolation structure is exposed between the vertical fin-type dielectric bottoms;
      a first conductive layer located on the vertical fin-type dielectric bottom; and
      a second conductive layer covering a portion of the first conductive layer and covering the exposed portion of the isolation structure between the vertical fin-type dielectric bottoms.

2. The high voltage device of claim 1, wherein the second conductive layer and the first conductive layer are insulated from each other.

3. The high voltage device of claim 2, wherein the thickness of each of the vertical fin-type dielectric bottom together with the isolation structure is about 13000~30000 angstroms.

4. The high voltage device of claim 2, wherein the thickness of the isolation structure is about 8000~12000 angstroms.

5. The high voltage device of claim 1, wherein the material of each of the vertical fin-type dielectric bottoms is selected from a group consisting of silicon oxide and silicon nitride.

6. The high voltage device of claim 1, wherein the material of the first conductive layer includes polysilicon.

7. The high voltage device of claim 1, wherein the material of the second conductive layer includes polysilicon.

8. The high voltage device of claim 1, wherein each of the vertical fin-type dielectric bottoms further comprises a sacrificed oxide layer covering the first conductive layer and located between the first conductive layer and the second conductive layer.

9. The high voltage device of claim 1, wherein, for each of the vertical fin-type dielectric layer, the first conductive layer and the second conductive layer are arranged alternatively.

10. The high voltage device of claim 1 further comprising:
    a source region located in the substrate;
    a drain region located in the substrate, wherein the isolation structure located on the substrate between the source region and the drain region;
    a channel region located in the substrate between the source region and the drift region; and
    a gate electrode located over the substrate and adjacent to the source region, wherein the gate electrode is an extension portion of the second conductive layer so that the gate electrode covers a portion of the isolation structure.

* * * * *